United States Patent

Kappenman et al.

[11] Patent Number: 6,047,119
[45] Date of Patent: Apr. 4, 2000

[54] METHOD FOR TRACKING, ANALYZING AND RESPONDING TO LIGHTNING SERVICE INTERRUPTIONS USING LCM TECHNOLOGY

[75] Inventors: John Gary Kappenman; David Lee Van House, both of Duluth, Minn.

[73] Assignee: Metatech Corporation, Goleta, Calif.

[21] Appl. No.: 08/885,241

[22] Filed: Jun. 30, 1997

[51] Int. Cl.[7] .............................. G06G 7/63; G06F 17/50
[52] U.S. Cl. .............................. 395/500.38; 395/500.25; 395/500.26
[58] Field of Search .................... 395/500.25, 500.26, 395/500.38

[56] References Cited

U.S. PATENT DOCUMENTS

| | | | |
|---|---|---|---|
| 5,331,330 | 7/1994 | Susnjara | 342/460 |
| 5,508,619 | 4/1996 | Ozawa et al. | 324/535 |
| 5,719,787 | 2/1998 | Chiang et al. | 364/551.01 |

OTHER PUBLICATIONS

G. Diendorfer, "Voltage Surges Induced On Overhead Lines by a Nearby Lightning Stroke" (4 pages) (1989 Zurich).
R. Freund et al., "Analysis of LEMP coupling effects into large loops in the time domain" (6 pages) (1993, Zurich).
A. Ben Rhouma et al., "Nearby Lightning Electromagetic (sic) Fields" (6 pages) (1995, Zurich).
Ali F. Imece et al., "Modeling Guidelines For Fast Front Transients", report prepared by the Fast Front Transients Task Force of the IEEE Modeling and Analysis of System Transients Working Group, pp. 1–18 (undated).
IEEE Standards Department, "P1410:Guide For Improving The Lightning Performance Of Electric Power Overhead Distribution Lines" Draft 7, Mar. 1997, ©IEEE 1995 (pp 1–41).
FALLS System Reference Manual, "Fault Analysis and Lightning Location System, System Reference Manual", © Global Atmospherics, Inc., Doc. #40119 REV 9512 (Dec. 11, 1995).
J.G. Anderson, "Chapter 12: Lightning Performance of Transmission Lines", pp. 545–597 (undated).

Primary Examiner—Kevin J. Teska
Assistant Examiner—Hugh Jones
Attorney, Agent, or Firm—Merchant & Gould P.C.

[57] ABSTRACT

A method for remotely tracking and analyzing lightning induced electric power disturbances to determine whether the disturbances were caused by malfunction of a specified transmission line and or asset of a selected segment of the impacted electric power transmission system or by lightning induced voltage or current levels on the specified transmission line and or asset that exceed voltage or current threshold levels for specified line and or asset.

2 Claims, 9 Drawing Sheets

METHOD FOR TRACKING, ANALYZING AND RESPONDING TO LIGHTNING SERVICE INTERRUPTIONS USING LCM TECHNOLOGY

FIELD OF THE INVENTION

The present invention relates generally to a system for use by utility companies for tracking the condition and performance of a transmission system. More particularly, the present invention relates to a system for detecting, analyzing and mitigating the impact of lightning events on a transmission system.

BACKGROUND OF THE INVENTION

Lightning strokes that are produced in electrical storms are the number one environmental cause of electric utility power interruptions across the United States. It is predicted that utility companies experience in excess of sixty percent of all their transmission system disturbances as a result of lightning events. Such lightning events also cause a majority of the damage that befalls a utility company's transmission system, which includes the thousands of miles of transmission lines that it owns, operates and maintains, and transmission line assets such as insulators, towers, etc. It is estimated that the damaging forces of lightning causes over one billion dollars in damage to homes, businesses, and forests, but most substantially, to electric power utilities.

Utilities have always been faced with the difficult task of maintaining their transmission system. The task is difficult because a transmission system covers a large amount of geographic territory, and the maintenance thereof must be performed in a limited amount of time with limited resources. Typically, utility companies maintain their transmission system assets by field inspectors who perform asset inspections out in the field. The inspection consists of performing a visual review of the assets to determine the assets' physical condition. For example, a large portion of a utility company's transmission lines are supported by miles of wood pole structures. Inspection of such wood pole structures are performed to assess whether the poles are damaged and whether the condition is likely to cause failures or disturbances.

Notwithstanding a utility company's efforts to perform physical inspection of its assets, a utility company cannot fully determine the performance characteristics (how the electrical parameters vary) of its transmission system assets based on field inspection data. Transmission system performance electrical characteristics are a much more difficult thing to assess. For example, it is not uncommon for the physical condition of a transmission system asset to appear to be in accordance with normal wear, when its performance condition is seriously deteriorated. This is a problem because the physical or visual appearance that the asset is normal when its electrical performance characteristics are poor may lead a utility company to believe that its assets can withstand lightning strokes of a certain magnitude and polarity when they cannot. When the performance characteristics of an asset are below normal, small lightning strokes may cause transmission system failure.

A common transmission system failure is an insulation flashover. Flashover involves poorly defined gas discharge physics, rapidly changing electromagnetic fields in which retardation plays a major role, nonlinear effects due to corona development on the conductors and on the tower itself, and frequency and current-dependent impedances on the earth. Insulation flashover may occur as a result of a number of factors, including: variations or increases in the tower footing resistance at each and/or every transmission system tower; a small puncture or deterioration of the transmission line insulators; or some subtle variation in some of those important electrical aspects. Flashover occurs when a lightning stroke hits a transmission line and either directly hits the energized conductor, or in many cases, indirectly hits the energized conductor by hitting some other portion of the structure, for example, the overhead shield wire. Such a direct or indirect strike by lightning causes the voltage to build up on that structure such that the voltage rise is large enough to cause the lightning to flashover the insulator to ground, thereby initiating a fault on the transmission line.

The problem with addressing flashover induced transmission system faults lies in the inability to address transmission system electrical weaknesses, which in most cases has a direct correlation to the electrical performance characteristics of the structure. Typically, assets that have electrical weaknesses also have electrical performance characteristics that are below normal. Addressing transmission system asset electrical weaknesses is a much more difficult task than assessing the mechanical and physical integrity of the asset. It is not an assessment task that can be performed by way of visual inspection.

It is possible for a utility company to discover poor performance characteristics through running diagnostic tests on its transmission system assets. However, to perform such tests would be difficult to implement and extremely expensive. There is a need for a method of determining performance characteristics without incurring the costs associated with diagnostic tests. There is also a need for a method of identifying deteriorated assets soon after the asset's performance characteristics fall below an acceptable level.

The need for a system that addresses the above described needs is further necessitated by the mandate of the Federal Energy Regulatory Commission (FERC) which requires the nation's electric utilities to open their private transmission systems to independent power companies. Independent power producers and competing producers will then use the electric utilities transmission system to move electricity from its source to their customers. The FERC is making these changes within the electric utilities industry to encourage competition for wholesale customers and perhaps eventually, retail customers. With the anticipated increased competition in the electric utilities industry resulting from the FERC's mandated open access, electric utility companies will be forced to increase the quality of their transmission systems and thereby the quality of electricity provided to customers. One of the ways in which quality will be increased is by reducing the number of disturbances and faults that occur on the electric utilities transmission system. Such quality increases will be necessary in order for utility companies to stay competitive in providing electric power to its customers, and because independent power producers and competing producers as customers using the utility company's transmission system will demand it.

A reduction in the number of disturbances or faults on an electric power utility transmission system has also become critical because the power quality requirements of electric power customers is substantially higher today than it used to be, and is constantly increasing. Advances in technology have and will continue to force customers to demand that electric utilities provide electrical power having increased consistency and fewer disturbances. By way of example, a larger number of customers are utilizing more sophisticated equipment that has higher voltage-sensitivity, such as computers and process control systems. Because lightning is in excess of sixty percent of all electric power transmission system disturbances, electric power utility companies are in need of a system and method that provides for a better understanding of the causal relationship between lightning and transmission system performance. With a better understanding of the causal relationship between lightning and utility transmission system performance, a utility company can take proactive steps in maintaining its transmission system, thereby reducing disturbances thereon.

Presently, the utility industry utilizes general purpose statistical modeling or simulation techniques to gain better understanding of the causal relationship between lightning and electric utility transmission system performance. The statistical modeling or simulation techniques used typically involve a computer simulation or modeling of the utility companies transmission system. Such models are typically of a digital simulation type wherein the transmission system assets and transmission lines are modeled to reflect performance in accordance with their defined characteristics. The model simulates the transmission system response to a plurality of different lightning engagement scenarios, wherein the lightning strokes are simulated at varying magnitudes and polarities. Analyzing the simulated transmission system's response to the plurality of different lightning conditions allows a utility company to make a hypothesis regarding how the actual transmission system lines and assets may perform in response to varying lightning events in the field. Such a hypothesis allows the utility company to make informed decisions concerning when utility assets may need to be replaced or repaired.

Although hypotheses regarding when utility assets may need to be replaced or repaired has proven useful, hypotheses generated from an electrical utility company's statistical modeling has significant drawbacks. The first draw back occurs because the structure of a transmission system stretches over a very large geographic area. As a result, hypotheses regarding the need for replacement or repair of a stretch of transmission line or assets on the transmission system is an expensive and difficult process. It is difficult because there are miles of transmission line and a large number of assets along the miles of transmission line with no way to pinpoint the exact location of the transmission system disturbance and thereby the section of the transmission line or the transmission system asset causing the disturbance. On the other hand, even if a transmission system disturbance could be located, the present simulation methods do not provide a means for determining whether the disturbance is a result of failing transmission system assets or a lightning event having a magnitude that causes a voltage on an asset that is greater than the voltage level capability of the asset.

Presently, there is no method of determining whether the transmission system assets that are at the root of lightning induced faults have performance problems that cause the fault. There is a need for a system and method whereby an electric power utility can perform an analysis on transmission system disturbances and faults to determine if the faults or disturbances are a result of the transmission assets not performing properly or whether the disturbance or fault occurs because the lightning event causes the voltage at the asset to exceed the threshold capability that the asset could withstand without a disturbance or fault. Such a system would eliminate replacement and repair of assets that are functioning properly but are involved in disturbances or faults caused by lightning events having a magnitude that causes the voltage level of the assets to exceed their threshold voltage capability.

Presently, in response to transmission system disturbances or faults, a utility company has no way of knowing or determining whether the disturbance or fault is a result of faulty transmission system assets, or whether the assets are performing properly and the lightning event magnitude causes the voltage level of the asset to exceed its threshold capability. Not knowing why faults and disturbances are occurring causes utility companies to make unnecessary replacement or repair of numerous assets in response to the disturbances or faults. Not knowing why fault and disturbances are occurring also causes delay of needed repairs as a larger statistically significant sample of events or faults are collected before a decision can be made to affect some change to an asset. Many of the assets replaced or repaired, including large sections of the transmission line, are typically performing in accordance within their appropriate specification levels. Such unnecessary replacement and repair results in substantial waste.

There is a need for a method and system that allows a utility company to more accurately pinpoint the location of faults and disturbances. There is also a need for a method or system that provides a means for analyzing the location of a fault or disturbance in order to determine whether the assets determined to have caused the fault or disturbance are functioning in accordance with their defined specification. The ability to more accurately pinpoint problem assets along a transmission system would result in substantial savings to a utility company. Such a system would eliminate premature replacement of assets and allow the utility company to utilize transmission assets for their full life.

The present invention provides a solution to the above needs and problems, and offers other advantages over the prior art.

SUMMARY OF THE INVENTION

The present invention relates to a method of servicing lightning induced disturbances occurring on a selected section or segment of the impacted electric power transmission system wherein remote tracking and analysis of the transmission system prior to service is performed by the following a plurality of steps resulting in location centered maintenance methodology. First, a transmission system simulation module for the selected section or segment of the impacted transmission system, is stored on a computer along with transmission system data. Transmission system data includes data representing every transmission system asset for the selected section or segment of the impacted transmission system and data representing transmission line function in accordance with the respective line performance characteristics. Next, lightning event data for a geographic locale of the selected section or segment of the impacted transmission system is collected. Next, disturbance data for a lightning induced disturbance on the selected section or segment of the impacted transmission system is collected. Next, a simulation of engagement by the lightning event causing the disturbance with the selected section or segment of the impacted transmission system is performed on the simulation module. Next, the lightning event engagement simulation readings are compared to the transmission system data. If the lightning event engagement simulation readings are greater than the transmission system critical levels, no repairs on the selected section or segment of the impacted transmission system are performed. On the other hand, if the lightning event engagement simulation readings are less than transmission system critical levels, repairs on the selected section or segment of the impacted transmission system are performed.

These and various other features as well as advantages which characterize the present invention will be apparent upon reading of the following detailed description and review of the associated drawings.

BRIEF DESCRIPTION OF THE DRAWINGS

In the drawings, wherein like reference letters and numerals designate corresponding elements throughout the several views.

DETAILED DESCRIPTION

Figure 1:
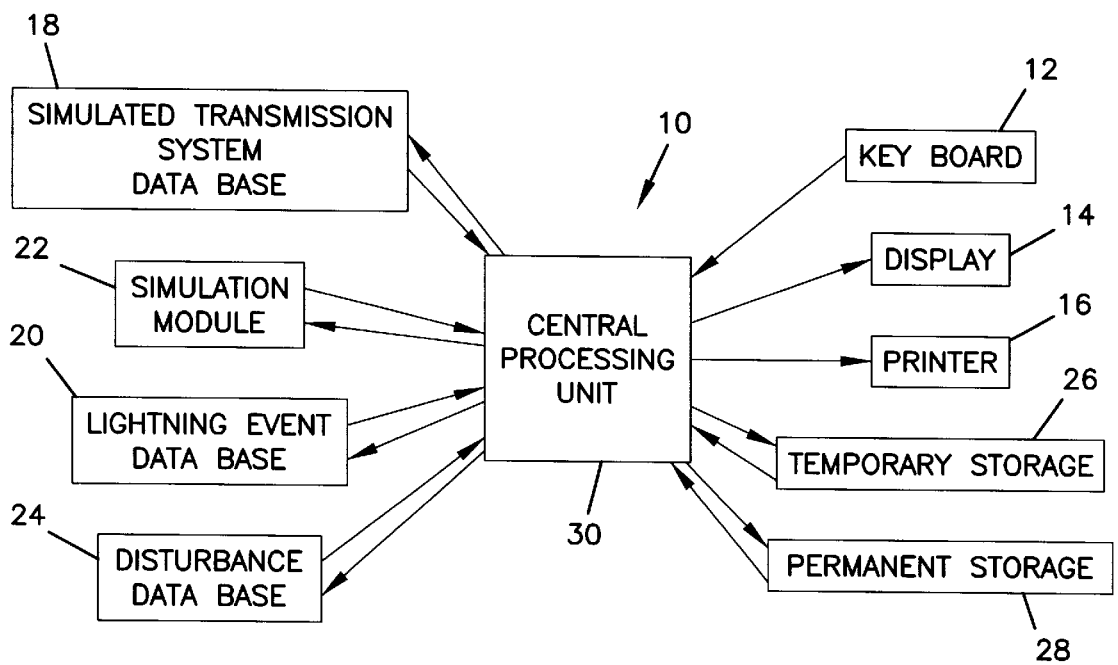
FIG. 1. is a simplified block diagram of a computer implemented system for simulating a power grid of a transmission system.

The present invention is a location centered maintenance methodology that allows an electric utility company to remotely assess each and every lightning caused fault or disturbance to quickly assess whether asset repair is needed or mitigation structures should be added to the transmission system as a result of the lightning induced fault or disturbance. Service such as asset repair or addition of mitigation structures is done only when a performance deficiency in the asset being evaluated caused the lightning induced fault or disturbance to occur. Through using location centered maintenance methodology, a utility company can remotely evaluate the electrical performance of transmission system lines and assets following transmission system disturbances. A common transmission system disturbance is a lightning strike induced transmission line failure. Such a failure may occur because the critical current of the transmission line asset is exceeded by the current of the lightning event that caused the disturbance. Such a failure may also occur because the critical withstand voltage of the asset engaged by the lightning strike is less than the voltage caused on the asset by the lightning strike. Insulation failure is an example of a failure caused by voltage build-up on an asset that exceeds the critical withstand voltage. Insulation failure is a sequence of events where a lightning strike hits a transmission tower and causes a voltage build-up on the insulator to a level causing the insulator to flashover to ground.

Location Centered Maintenance methodology utilizes lightning data for specific lightning events and transmission system disturbance data in conjunction with transmission system standard performance data and a computer simulated transmission system module that simulates standard performance of a specified selected section or segment of the impacted transmission system to determine the condition of transmission system assets following transmission system disturbance. Location centered maintenance methodology is achieved generally by performing the following steps: collecting discrete lightning event data for a geographic locale of the selected section or segment of the impacted transmission system in response to a lightning induced system disturbance; collecting discrete data reflecting the disturbance; simulating on a computer implemented simulated transmission system, engagement of the disturbance causing lightning event at a specified location within a selected section or segment of the impacted transmission system, yielding simulation data; comparing the simulation data to the transmission system data; and if the simulation data values are greater than transmission system critical levels, no repairs on the selected section or segment of the impacted transmission system are performed; on the other hand, if the simulation data values are less than the transmission system critical levels, repairs on the selected section or segment of the impacted transmission system are evaluated and the performed once verified by a field visit.

The lightning data for specific lightning events includes data representing the polarity, magnitude and Global Positioning System (GPS) time stamp of a specific cloud-to-ground lightning strike. The step of collecting discrete lightning event data may be performed by acquiring the data from an outside source such as the National Lightning Detection Network (NLDN). NLDN is an organization which collects data representing virtually every cloud-to-ground strike lightning event that occurs. The data representing the location of a particular cloud-to-ground lightning strike includes longitudinal and latitudinal data coordinates which pin-point the exact location of the lightning event within a 300–500 meter range of accuracy. The computer implemented simulation system utilizes the discrete lightning event data to provide a close to accurate simulation of the effects a particular lightning stroke had on the selected section or segment of the impacted transmission system. The combination of the simulated system and discrete lightning data provides a utility company with the ability to more accurately analyze every lightning stroke induced disturbance on its transmission system with a high level of accuracy.

The specific discrete lighting stroke data is critical to the analysis portion of location centered maintenance methodology because it significantly reduces hypotheses from that of a statistical nature to an analysis of the effect specific lightning events may have on a transmission system. Many lightning events do not produce problems for a utility company's transmission system. Only a very small subset of the total lightning data collected correlates to or creates power system disturbances. The use of discrete lightning data provides a means for determining the exact lightning event that caused a particular disturbance.

The transmission system disturbance data includes a GPS mapped transmission line location reference of the disturbance, GPS time stamp of the disturbance and other disturbance data. The step of collecting such disturbance data may be performed by the utility company through use of a constant monitoring system that monitors the transmission system for lightning duty and structure specific performance. A constant monitoring system includes the use of relays, disturbance recorders deployed on the transmission system network and GPS time clocks (which allow precise time correlations). The processing of accurate transmission system disturbance data in conjunction with accurate lightning data, provides the ability to accurately pinpoint the location of lightning caused disturbances virtually to the assets responsible for the disturbance. The lightning data and disturbance data is loaded onto a computer and a program entitled "Fault Analysis and Lightning Location System" FALLS determines the location of the lightning event by processing the GPS time stamps of the lightning and disturbance data. The GPS time-stamp on lightning data and disturbance data is used to enhance the accuracy of both lightning and transmission system disturbance data, by making the data spatially and temporally accurate.

The computer implemented simulation system processes lightning event data and disturbance data in conjunction with data representing the model of the transmission system to perform an analysis of the effects lightning events and disturbances detected have had on transmission system assets. The simulation module implemented into the computer system may be any one of a number of known simulation modules that are commercially available. In this particular embodiment, the Electromagnetic Transients Program (EMTP) is utilized as the simulation module. An example of an EMTP modeling approach is described in detail below in reference to FIGS. 7 and 8.

Typically, a transmission system module precisely maps a majority of an electric utility company's transmission lines (lines at the 46 kV through—through 500 kV voltage levels). The model further includes mapping of transmission system assets in their proper position, performing their proper functionality in accordance with their respective performance characteristics. The coordinate data representing the coordinates for the terminals of the transmission lines, along with existing plan and profile data for the intervening line sections are mapped using Geographical Information System (GIS) data. Mapping assets through a GIS data base allows for the assets to be mapped spatially. The spatial correlation provided by GIS mapping allows for the transmission system line sections for most structures to be mapped within a five meter tolerance. Accurate fault timing is obtained by adding GPS based precision timing equipment to the transmission system constant monitoring system. The data representing fault timing is part of the disturbance data recorded, and is processed along with all other disturbance data.

The ability to accurately pinpoint the timing of a fault or system disturbance is critical to location centered methodology. There can be numerous flashes which correlate to both the general timing and location criteria of a disturbance. However, through the use of GPS based precision timing equipment, accurate timing of transmission system faults can be determined. Accurate fault timing allows for the identification of the specific stroke that caused the fault along with the transmission system structure to be located.

As shown in FIG. 1, the data representation of the modeled transmission system is stored on the simulated transmission system data base 18. The central processing unit 30 processes the data representation of the modeled transmission system in accordance with the simulation module 22 to simulate a properly functioning transmission system. The computer implemented system 10 is comprised of a keyboard 12, display device 14, printer 16, simulated transmission system data base 18, lightning event data base 20, simulation module 22, disturbance data base 24, temporary storage 26, permanent storage 28 and central processing unit 30. Data stored within the disturbance data base 24 represents data collected by the utility company representing disturbances occurring on the transmission system. Data stored in the lightning event data base 20 includes data representing specific lightning strikes that occurred near the transmission system disturbance around the time of the disturbance.

The performance of a transmission system has been traditionally viewed using a statistical technique because it is extremely difficult to troubleshoot a modeled transmission system with no idea as to the size of the lightning event that should be modeled as engaging the modeled transmission system. The fact that lightning events can range from 5000 amp strokes up to 200,000 amp strokes underscores the uncertainty. The present invention eliminates statistical methodology by allowing a utility company to specifically correlate data representing a known lightning impulse with a specific section of the transmission system to assess performance of the asset or line segment in response to engagement by the known lighting stroke. Next, the system provides a means for determining what the response to engagement of the known lightning impulse would be based on the design characteristics of the particular asset and line section of the transmission system. The system performs this function by a comparison of the data representing the modeled transmission system response to the actual lightning and disturbance data. The comparison assists in determining whether the system disturbance occurred as a result of failing assets or transmission line sections or because the lightning event caused a voltage build-up on the assets or current level on the transmission line such that the voltage or current levels caused the lightning to flashover to ground, thereby initiating transmission system fault.

Figure 2A:
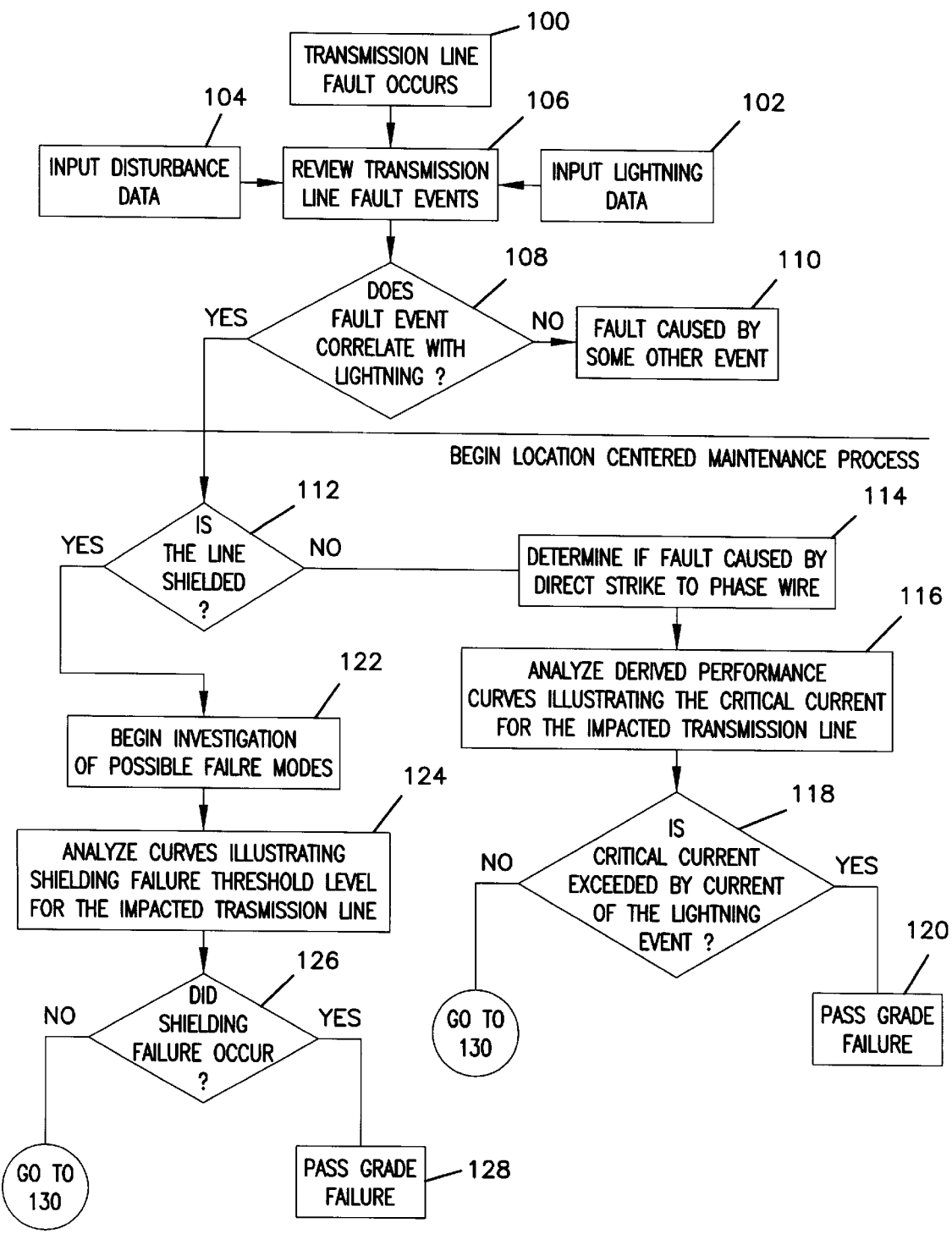
FIGS. 2a and 2b is a simplified block diagram of a flowchart detailing an embodiment of steps involved in location centered maintenance methodology.
Figure 2B:
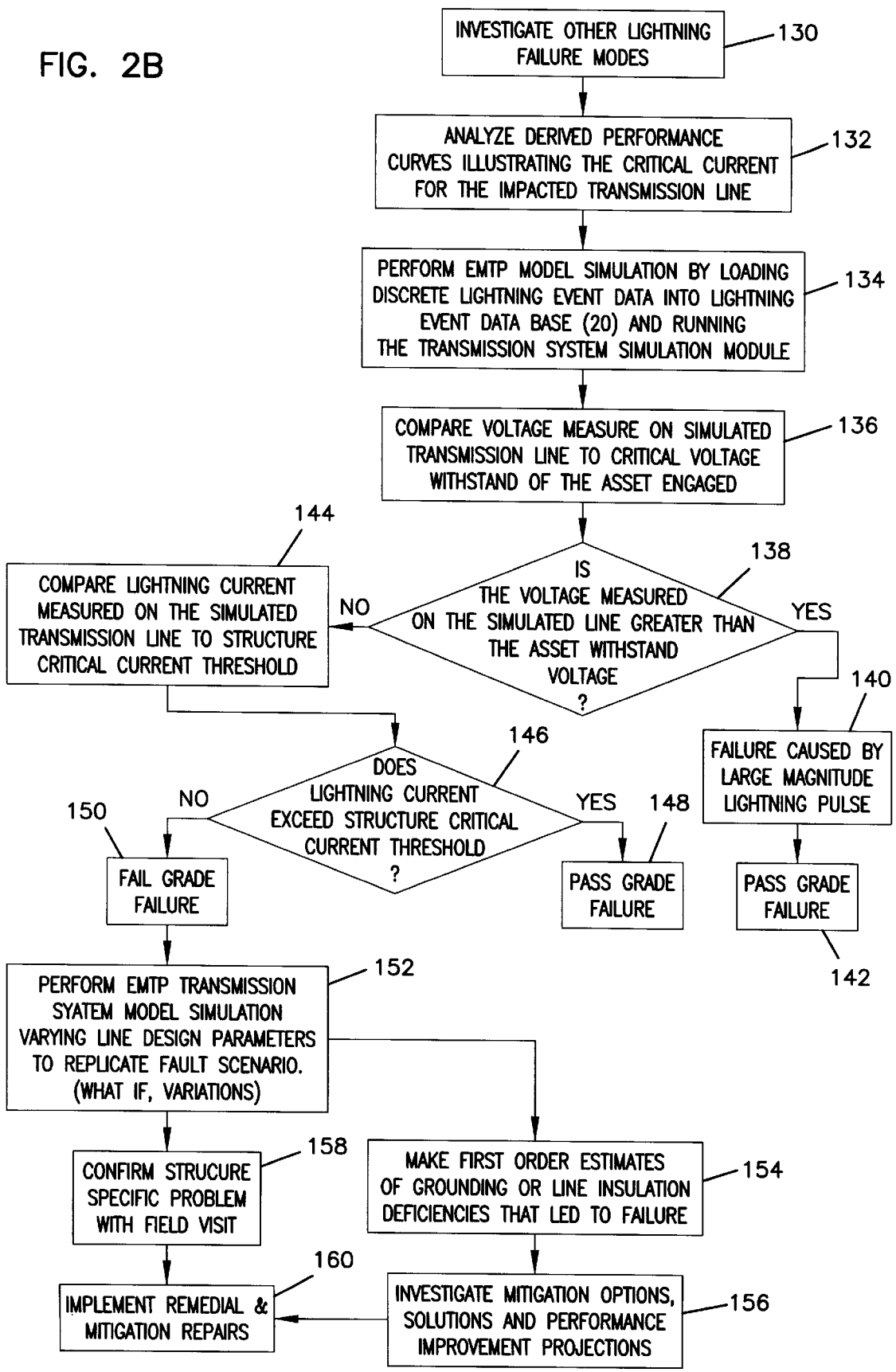

One method of performing a location centered maintenance methodology analysis of an electric utility company's transmission system may be implemented by performing the steps shown in FIGS. 2a and 2b. First, a transmission system fault or disturbance must occur 100. In response thereto, because the transmission system is being monitored at all times, data representing the lightning events occurring around the time of and in the general vicinity of the disturbance 102 is analyzed along with transmission system disturbance data 104 (GPS mapped transmission line location reference of the disturbance, GPS time stamp of the disturbance) 106. In reviewing the lightning event data and disturbance data 106 a determination must be made as to whether the fault event correlates with a specific disturbance event 108. The lightning event data includes data representing the magnitude and polarity of particular lightning events as well as the GPS time stamp data and location of the lightning event within a 300–500 meter range of accuracy. This discrete lightning event data is transferred to the computer system lightning event data base. The system then processes the discrete lightning data and disturbance data simultaneously in accordance with a program provided by NLDN entitled Fault Analysis Lightning Location System (FALLS) to determine which of the plurality of lightning events loaded caused the system disturbance. This is typically determined by matching the location and GPS time stamp of the transmission system disturbance or fault against the location and GPS time stamp on each lightning stroke stored. If correlating time stamps are not located, the fault was caused by some other event 110. If correlating time stamps are determined to exist, the location centered maintenance process begins. The first determination to be made in location maintenance methodology is to determine whether the line is shielded or unshielded 112. If the line is unshielded, an analysis of the disturbance data and lightning data is performed to determine if the fault was caused by a direct strike to the phase wire on which the disturbance may have occurred 114. The phase wire can be located by the longitudinal and latitudinal data coordinates for the lightning strike (which pin-points the exact location of the lightning event within a 300–500 meter range of accuracy) and the GPS mapped transmission line location reference of the disturbance. The analysis of whether a fault is caused by a direct strike to the phase wire involves analysis of performance data illustrating the critical current for the impacted transmission line in view of the lightning event 116. In this embodiment performance curves are used in the analysis of performance data. It is to be understood that analysis of performance curves is not the only means of analyzing performance data. In other embodiments, the performance data could be stored in a data base and accessed by way of a computer implemented look-up system. If the transmission line or asset critical current is exceeded by the current of the lightning event 118, the disturbance is recognized as a pass grade failure 120. This means that although there was a failure, the failure would have occurred regardless of the condition of the transmission system line and assets. In addition, a pass grade failure is based on line design performance expectation versus lightning duty. Lightning duty is the current measured on the transmission line. The design performance is the transmission line critical current a particular asset should be able to withstand before disturbance or failure. On the other hand, if the critical current is less than the current of the lightning event, then the investigation of possible failure modes other than due to a direct strike failure begin 130.

If the transmission line was shielded, the investigation of all possible failure modes begins 122. The first possible failure mode to check, is shielding failure. Shielding failure is checked for by analyzing threshold data (in this embodiment threshold curves) illustrating shielding failure thresholds for the impacted transmission line 124. If shielding failure did occur 126, the disturbance is recognized as a pass grade failure 128. This means that although there was a failure, the failure would have occurred regardless of the condition of the transmission system line and assets. If shielding failure does not occur 126, investigation of other lightning failure modes is begun 130.

In the investigation for other failure modes, the examination begins with an analysis of the performance data (in this embodiment performance curves) illustrating the critical current for the impacted transmission line 132. Next, EMTP transmission system model simulation is performed by loading discrete lightning event data which caused the disturbance into the lightning event data base on the computer implemented system. Next, the transmission system simulation module is run 134, yielding simulation data. The simulated line voltage data is compared to the critical line withstand voltage of the transmission system line being analyzed 136. If the simulated line voltage measured is greater than the critical voltage withstand of the asset engaged 138, then failure was caused by a large magnitude lightning pulse 142. Such a flashover disturbance is recognized as a pass grade failure 140, because the failure would have occurred regardless of the condition of the transmission system line and assets. On the other hand, if the simulated voltage is less than the critical voltage withstand, the problem is not due to voltage, and an analysis of the lightning event current is begun 144. In the current analysis, the lightning current measured on the simulated transmission line is compared to the transmission line critical current threshold 144. If the simulated lightning current exceeds the structures critical current threshold 146, then failure was caused by a large current and receives a pass grade failure 148. The pass grade failure 148 is issued in this case because the failure would have occurred regardless of the condition of the transmission system line and assets. On the other hand, if the lightning current does not exceed the critical current threshold level 146, a fail grade failure is issued 150. A fail grade failure gives notice that the failure was a result of some type of deficiency in the transmission system equipment. In order to locate the deficiency, the EMTP transmission system model simulation is performed again 152. However, the transmission system line design parameters are now varied to replicate disturbance data yielded in the fault scenario. The fault simulation data resulting from simulation of disturbance data can be analyzed to make estimates regarding the deficiencies causing fault 154. The estimated faults are investigated to determine the mitigation options and solutions that would bring about the most efficient performance improvement 156. Next, the remedial and mitigation repairs are implemented 160. On the other hand, if the fault simulation data resulting from the simulation of fault data was analyzed and confirmed that a structure specific problem exists 158, remedial and mitigation repairs would be implemented.

Generally, in EMTP transmission system simulation, if the result of simulating the engagement of an actual lightning event with a properly functioning system has the effect of a system failure, and the lightning duty on the transmission line is greater than the line withstand for the asset, notice of a passing grade failure will be rendered. A pass grade informs the utility company that no matter what the condition of the asset, the system would have failed. Therefore, no further analysis of the results of the actual system disturbance data and the simulated disturbance data is need.

On the other hand, if the result of simulating the engagement of the actual lightning event with a properly functioning system has the effect of a system failure, and the lightning duty on the transmission line is less than the line withstand for the asset, notice of a failing grade failure will be rendered. A failing grade immediately gives notice that something is wrong with the transmission system line or assets and prompts the system to perform additional processing of the disturbance data and simulation data. The system then further processes and compares the simulated resultant data to the actual disturbance or fault data providing insight into the problem causing the poor performance characteristics. From this information a utility company can try to determine the cause of the failure and whether the asset needs to be replaced or repaired. For example, if the lightning event caused an insulation flashover, the simulation model may inform the user that the structure should not have had an insulation flashover or failure due to that lightning event. This would also be informing the utility company that some form of maintenance attention to the utility asset may be warranted. Because the discrete lightening event data identifies the magnitude and polarity of that lightning event as well as the location of the lightening event within about a 300 to 500 meter range of accuracy, a utility company has the ability to pinpoint the performance problem and perform more targeted and efficient system maintenance if warranted.

Figure 3:
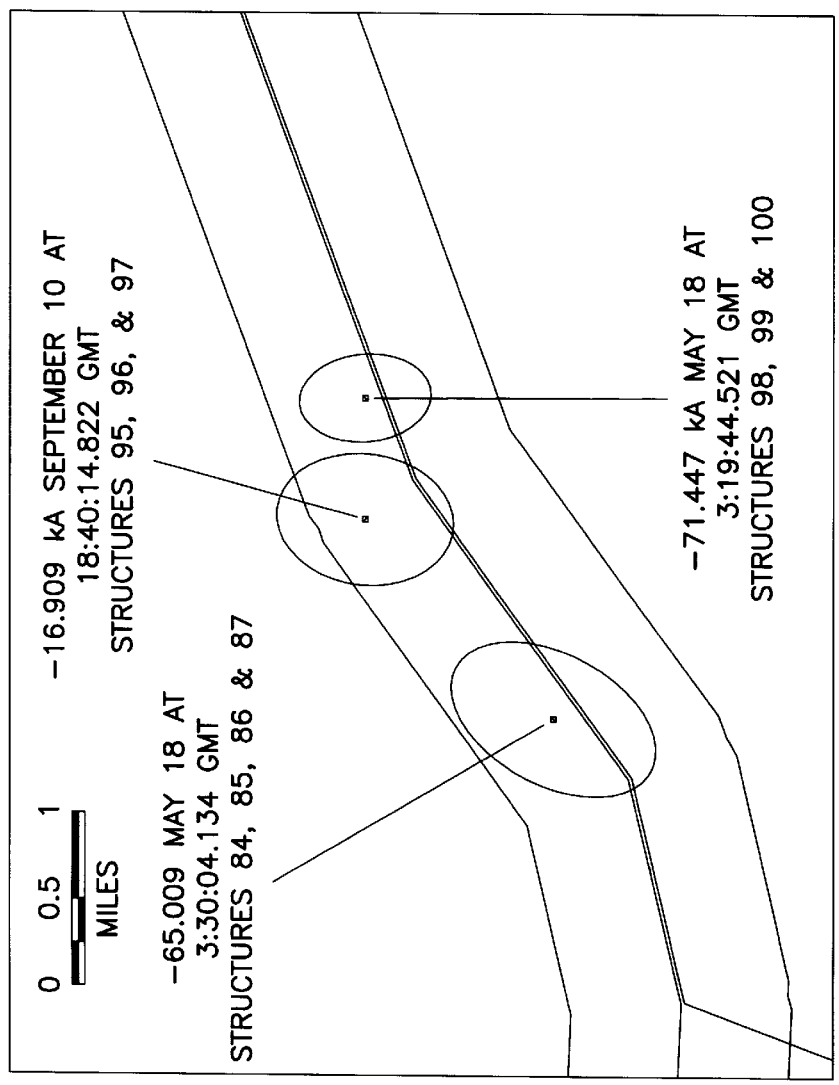
FIG. 3 is a section of a transmission line route illustrating lightning induced faults and the correlating lightning stroke data.

In providing further illustration, the above described location centered maintenance methodology is applied to a 230 kV transmission line section of a transmission system. FIG. 3 shows a portion of the route of a 230 kV line and the locations, times, and magnitudes of lightning strokes that resulted in faults to the transmission line. The transmission lines were constructed with overhead shield wires to prevent direct lightning strikes to the energized phase conductors. Therefore, disturbances caused by direct lightning strikes should have a statistically low probability of occurrence. Based upon the prescribed design practice for this voltage level transmission line, it should have been able to withstand a lightning stroke in excess of 100 kA without resulting in a backflash failure. As shown in FIG. 3 and table 1 below, the lightning stroke magnitudes that occurred were only 17 kA, 65 kA and 71 kA in magnitude.

TABLE 1

|  | Strike 1 | Strike 2 | Strike 3 |
|---|---|---|---|
| Date | 5/18/96 | 5/18/96 | 9/10/96 |
| Hour | 3 | 3 | 18 |
| Minute | 19 | 30 | 40 |
| Second | 44 | 4 | 14 |
| millisec | 521.91 | 134.231 | 822.891 |
| Latitude | 47.5497 | 47.5343 | 47.5497 |
| Longitude | −92.7257 | −92.7649 | −92.7405 |
| Signal | 71.447 | 65.009 | −16.909 |
| Multi | 0 | 0 | 0 |
| E11_Angle | 354.3 | 27.7 | 6 |

Figure 4:
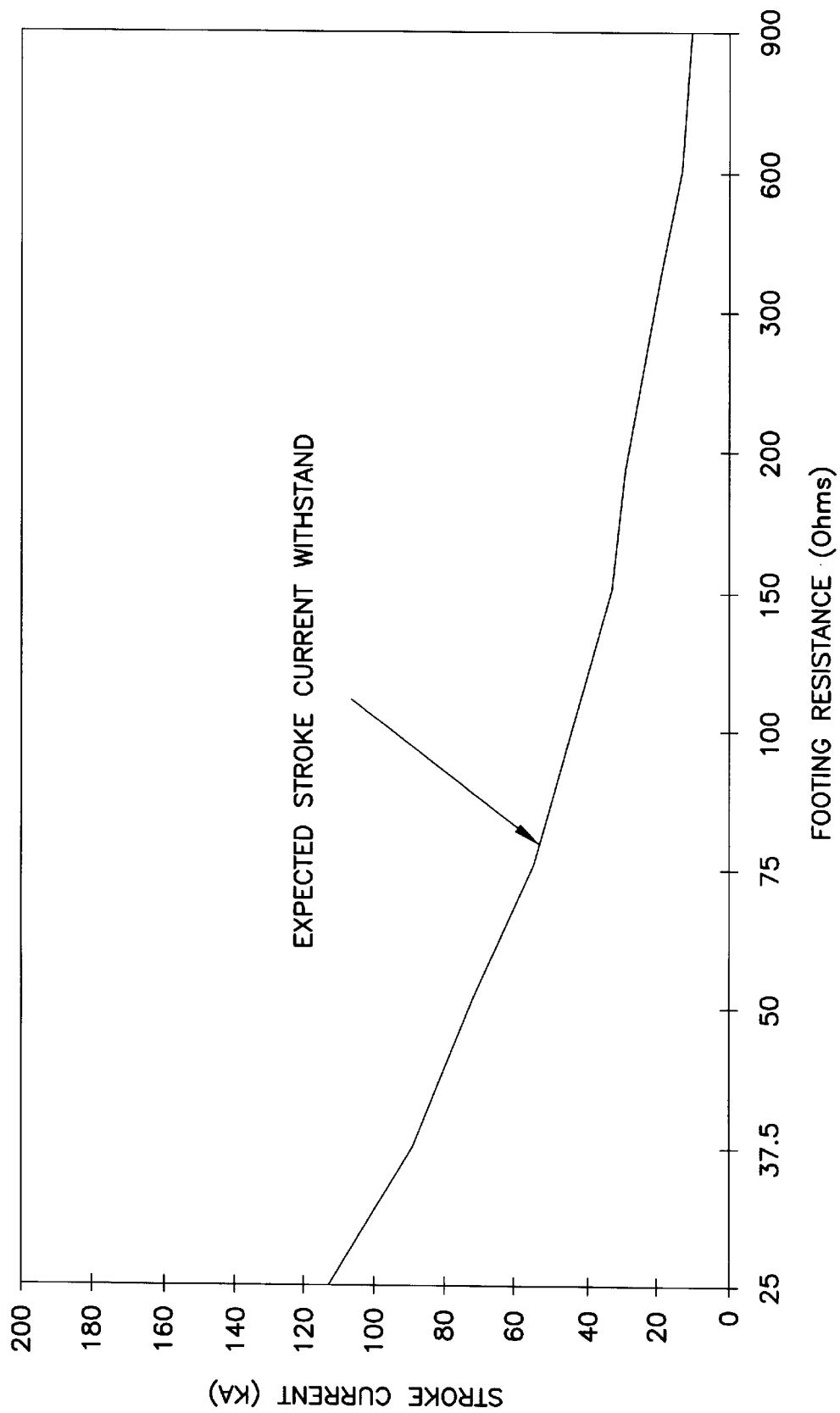
FIG. 4 is a 230 kV lightning performance design curve.
Figure 5:
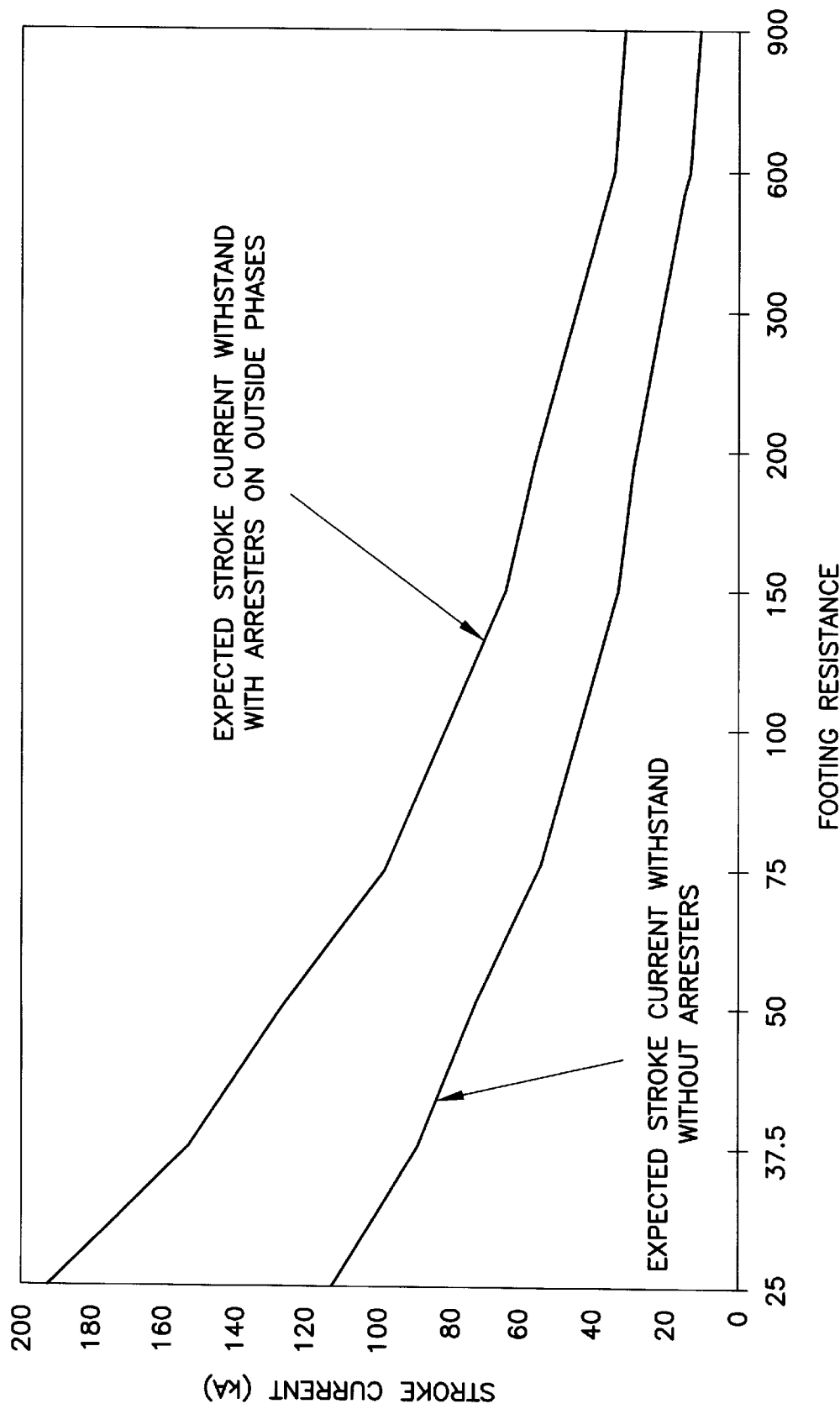
FIG. 5 is a 230 kV lightning performance design curve illustrating the expected stroke current withstand without arresters and the expected stroke current withstand with arresters on the outside phases.

FIG. 4 is a performance curve for the transmission line design that is under study in this analysis. When lines are constructed, it is the usual design practice in the 230 kV line voltage class to provide a tower footing resistance at each and every structure of 25 ohms so as to allow a lightning stroke current magnitude (i.e. critical lightning current) of approximately 113 kA. Further, as the tower footing resistance increases, the critical lightning current withstand decreases. For example, increasing the tower footing resistance to about 100 ohms per structure decreases the lightning current withstand to about 44 kA. The critical lightning current levels on structures continue to decrease in proportion to increasing tower footing resistances as illustrated by the sloping curve shown in FIG. 4.

As noted above, the preliminary performance analysis for the 230 kV transmission line should have been able to withstand the lightning strokes that precipitated the fault events. Given this determined shortcoming in performance, various additional analysis work can be performed to evaluate the probable failure causes or structure electrical performance deficiencies that need to be corrected. The first performance deficiency cause that was evaluated is that due to shielding failure. It is well established that as the magnitude of lightning current increases, the area surrounding an overhead shield wire that provides effective lightning shielding also increases. As a result, when lightning strikes within that area, it will terminate harmlessly on the shield wire rather than on the energized conductor which is usually located beneath the shield wire. However, for low magnitude lightning strokes, the resulting area of protection around the shield wire diminishes, and if the lightning current is low-enough the area of protection offered by the shield wire may not be adequate to protect the energized phase wire from a direct lightning strike (i.e. a shielding failure would result). The probability of shielding failure can be calculated using the Electro-Geometric modeling guidelines described in Proposed IEEE 1234 *Guide for Improving Lightning Performance of Transmission Lines*. Using the tower spacing and configuration of this line and calculating the shielding performance at the lowest incident lightning strike of 17 kA, the calculations indicate that at this current level a shielding failure (i.e. direct lightning strike to one of the three energized phase conductors) was not likely. Further, based upon the tower configuration in that section of the transmission line, the lightning current would have to be below 7.5 kA to lead to a shielding failure. Since the other two lightning strokes that produced faults were much higher in magnitude, a shielding failure for this line can be ruled out as the likely root-cause.

Induced over voltages (a voltage rise on the impacted circuit caused by a lightning strike that hits the ground nearby a transmission line and causes an induced over voltage on that line) is another failure cause possibility for lower voltage lines. However, it is commonly accepted and demonstrated in the industry that induced over voltages are unlikely for high-voltage lines such as this 230 kV circuit due to the inherently high withstand of the line insulation. This failure scenario given a 230 kV voltage withstand would require a nearby lightning stroke of unusually large magnitude to create a high enough induced voltage to result in failure. The three correlated lightning events were all mid to low range magnitudes and none over 75 kA.

Since shielding failure and induced over voltage have been eliminated as likely causes for the three failures, the remaining scenario that could result in those failures is one in which lightning would strike the shield wire as designed and create a voltage rise of the transmission structure sufficient to flashover (or fail) the insulation from the structure to the energized phase conductor (i.e. back flashover). This back flashover can usually be attributed to a high tower footing resistance, but other failure modes can also be present such as damaged or weakened insulators, some discontinuity of the ground leads or other tower specific structural problems. A line and structure specific electromagnetic simulation model 22 (such as the Electromagnetic Transience Program (EMTP)) can be utilized in a computer implemented system 10 to simulate the lightning event scenario. Since precise magnitudes of lightning current are now known; a valid forensic simulation can be conducted to analyze voltage potential rises and distributions to estimate the precise condition and point of insulation failure on the structure. In the past these simulation models lacked that precise lightning data to perform this type of forensic analysis. The usual approach available has been to calculate a critical lightning current in which a flashover would be a high probability result if exceeded. A statistical simulation using a range of lightning magnitudes that would align with an expected natural distribution would also be able to extrapolate some performance ability (i.e. failure rate) of the asset over a sufficiently long period of time. The technique, however, would not provide an ability to analyze in forensic detail on an event by event basis in the manner location centered maintenance methodology performs. Only a large sample of failure events accumulated over a sufficiently long period of time (i.e. up to 10 years) would allow comparison of actual performance versus expected design performance. Therefore, conventional methods would not allow the ability to rapidly detect a change or deterioration in asset performance on an immediate basis, further this would only indicate performance of the asset as a whole and would not be able to identify specific areas of the asset which are the root-cause of the problem. Whereas, Location-Centered Maintenance methodology will allow immediate event by event forensic evaluation and will pinpoint specific failure modes to the structure and associated apparatus on that structure.

The performance curves developed in FIG. 4 were the product of a series of simulations performed by the central processing unit 30 in conjunction with the simulation module 22 to determine the lightning critical current threshold for various tower footing resistance values. Based upon the critical current levels projected and the resulting lightning stroke magnitudes that precipitated failure, it would be expected that the tower footing resistance in the area of these faults would be very high and perhaps have an average value of as much as 300 ohms or more in some specific grounding points. As a verification of this remote performance evaluation and condition assessment diagnostic, a field inspection was performed to measure the specific tower footing resistances in that region of the line. Table 2 shown below provides the results of measured grounding resistances at each of the transmission line structures.

TABLE 2

| Structure | 100 | 400 | 410 | ohms |
|---|---|---|---|---|
| Structure | 99 | 650 | 460 | ohms |
| Structure | 98 | 950 | 650 | ohms |
| Structure | 97 | 850 | 1150 | ohms |
| Structure | 96 | 150 | — | ohms |
| Structure | 95 | 395 | 450 | ohms |
| Structure | 87 | 64 | 24 | ohms |
| Structure | 86 | 440 | 490 | ohms |
| Structure | 85 | 500 | — | ohms |
| Structure | 84 | 140 | — | ohms |

Note that values of over 400 ohms were verified at several locations, values of over 100 ohms were a common condition throughout the 10 separate structures that were evaluated in this region of the line. For example, the outage caused by the 17 kA lightning stroke which impacted structure number 95 had a critical current of approximately 17 kA, based upon the 395 ohm and 450 ohm tower footing resistances at that structure. The May 18, 1996 disturbance, which was due to a 65 kA lightning stroke, occurred at structure numbers 85 and 86. These structures had tower footing resistances of 440 to 500 ohms, which would have resulted in a critical current of approximately 15 kA and as a result leads to a clearly definitive and immediate evaluation of the likely failure mode for all three of these events.

Corrective actions can also be predictively evaluated to assess the optimum performance improvements possible for an impacted asset. In the case of this particular asset, the most obvious, corrective action would be to improve the grounding systems at each of the towers in order to lower the tower footing resistance. As shown in FIG. 4, the decrease in tower footing resistance at each structure can be approximately evaluated by the performance curve depiction. For example, with structure number 95, an improvement in tower footing resistance from its present resistance of approximately 400 ohms to a value of 37.5 ohms would increase the back flashover critical current threshold from only 17 kA to approximately 89 kA. This would provide a 423% increase in critical current withstand. Further, the probability of a stroke with a current of 17 kA or larger striking the line is much greater than that of a stroke with a current of 89 kA or larger. For example, Table 3 below shows that a 17 kA or larger stroke has a 81.5% probability of occurring near the line, whereas a stroke with a current magnitude of 89 kA or larger has a probability of occurrence of only 2.34%.

TABLE 3

Measured Lightning Current
Magnitude Distribution

| Percent of Strokes with currents equal to or lower | Stroke Current kA |
|---|---|
| 0 | −9.065 |
| 5 | −12.8575 |
| 10 | −14.726 |
| 15 | −16.2985 |
| 20 | −17.1865 |

TABLE 3-continued

Measured Lightning Current
Magnitude Distribution

| Percent of Strokes with currents equal to or lower | Stroke Current kA |
|---|---|
| 25 | −18.204 |
| 30 | −19.129 |
| 35 | −20.35 |
| 40 | −21.4045 |
| 45 | −22.5885 |
| 50 | −24.124 |
| 55 | −25.0675 |
| 60 | −26.5105 |
| 65 | −28.342 |
| 70 | −31.524 |
| 75 | −33.6145 |
| 80 | −36.7595 |
| 85 | −42.0875 |
| 90 | −50.764 |
| 95 | −70.3185 |
| 100 | −145.835 |

Therefore in order to determine the expected outage rate improvement provided by increasing the critical current threshold, the probability distribution of lightning stroke current magnitudes must also be considered. Using methods described in Annex B of the *IEEE P*1243 *Guide*, an expected outage rate can be calculated that would project the long term outage rate of the transmission line. The calculation takes into account both the critical current threshold and the stroke current magnitude probabilities. For the line at structure number 95 as presently configured, the critical current withstand is 17 kA and the percent of lightning strokes equal to or greater than 17 kA that have occurred near the asset have been 81% of all lightning strikes. Using the calculation described in Annex B, a failure rate of 8.37 faults/100 km/year would be the expected long-term performance average of the asset. This failure rate calculation makes the unrealistic assumption that all structures along the 37.2 km line have tower footing resistances identical to structure number 95, most structures will in actuality have a much lower tower footing resistance. A modification of tower footing resistance which would boost the critical current to 89 kA can also be used with the 2.34% stroke current probability to project a long-term line failure rate average of 0.24 faults/100 km/year. The improvement from a 8.37 fault/100 km/year average to a 0.24 fault/100 km/year average that would be realized is a 3387% overall performance improvement taking into account the cumulative effect of the higher critical current withstand with the lower probability of a higher lightning stroke current magnitude. These IEEE P1243 Guide calculations would give a reasonable estimate of long-term performance if all structure design factors and lightning exposure factors were identical along the entire length of the line. However, they are meaningless to take in isolation without an event by event knowledge of lightning and structure specific design conditions. Nor would they be useful to determine a change or deterioration in line performance/condition unless a very large sample or long duration of exposure is used. Further, since these guide methods were intended to evaluate the performance of an entire line rather than a specific structure, this would not provide a readily useful means of extracting a deterioration of performance that may be limited to a small portion of the lines total length or even just a few specific structures in that line. The Location-Centered Maintenance technique as described above used an event-by-event forensic analysis to immediately and precisely determine a structure specific performance problem, make detailed assessments on the exact performance deficiency, and identify immediate and targeted upgrades to those specific structures to improve performance. This method when applied should result in faster and more targeted remedies (and therefore more economic solutions since they can be done only at specific structures and not blanketed across an entire line) than the industry prescribed methods contained in the IEEE P1243 Guide. This is because it can determine the performance problems immediately (while the IEEE P1243 Guide would take a long period of time) and because the method allows structure specific assessments to be made while the IEEE Guide projects performance of an entire line.

Another method for improving the performance of the structures would be to add lightning arresters which would be connected from the energized phases to ground. These arresters are designed to begin conduction when voltage rises above a prescribed threshold and would continue to conduct until voltage decreased below that threshold. In the application for a back flashover mode of failure, the tower voltage will rise significantly due to the charge buildup caused by the lightning strike. The arrester which is connected from the structure ground to an energized phase will begin conducting as soon as the tower potential rises above the combination conduction voltage of the arrester and energized phase voltage to which the arrester is attached. In cases such as this, the transmission line structures are located in a region of ledge rock outcropping and adding driven ground rods to lower the tower footing resistance is either impractical or ineffective. FIG. 4 illustrates a set of line performance curves similar to those described in FIG. 4 with the exception that the structures have been modified by adding 180 kV lightning arresters on the two outside phases of the structure. This results in a significant increase in critical current at all tower footing resistance levels as noted by comparison with the performance curve of the line without arresters. Again the example of the structure #95 with a 400 ohm footing resistance, the critical current withstand increased from 17 kA to approximately 42 kA, which is a boost of 147% in critical current withstand for the structures. In addition, the probability distribution of lightning experienced in the vicinity of this line indicates that lightning exceeding 42kA occurs in only 15.4% of all lightning strokes.

Validation of performance improvements may also be implemented by way of location-centered maintenance methodology. In assessing a recent upgrade project, location-centered maintenance was used to assess the performance of an upgrade project involving the 71/21 Line 115 kV double circuit. The upgraded line was a 5-mile, shielded, double circuit. Historically, the lightning performance of this line averaged 33 incidents per 100 mile/year, which was considered unacceptable. The primary problem that resulted in this poor line performance was the ledge rock outcroppings in the region in which the line was constructed which prevented the ability to obtain low-resistance tower grounding. In order to improve performance, arresters were added to the bottom phases of each structure during the late spring of 1994. The line experienced two faults during a 18 month period, at which time the line was then upgraded. From the time the upgrade was complete until 18 months later, one fault occurred. Although it would appear that some improvement occurred, based only on the number of faults the line received before versus after the upgrade, it would not appear that performance was greatly improved. However, the period prior to the upgrade experienced lower than average lightning activity, and the several years after the upgrade a significant increase in lightning activity has been experienced. The comparison of lightning exposure for the facility immediately prior to and after the upgrade is shown in Table 4 below. For this example, this analysis demonstrates that the fault to lightning exposure ratio (as calculated in the Strokes/Fault/Year summary in Table 4 below) has improved by nearly 343%, given the short sample time and the small number of disturbances.

TABLE 4

| | Line Performance Verification (Before/After Upgrade) | | |
|---|---|---|---|
| | 1993–1994 Prior to Upgrade | 1994–1996 After Upgrade | Performance Percent Improvement |
| Faults | 2 | 1 | 100% |
| Faults/100 mi/Year | 33* | 8.0*** | 313% |
| Exposure (strokes) | 87** | 321*** | — |
| Strokes/Fault | 43.5** | 321*** | 638% |
| Strokes/Fault/Year | 29*** | 128*** | 343% |

Figure 6:
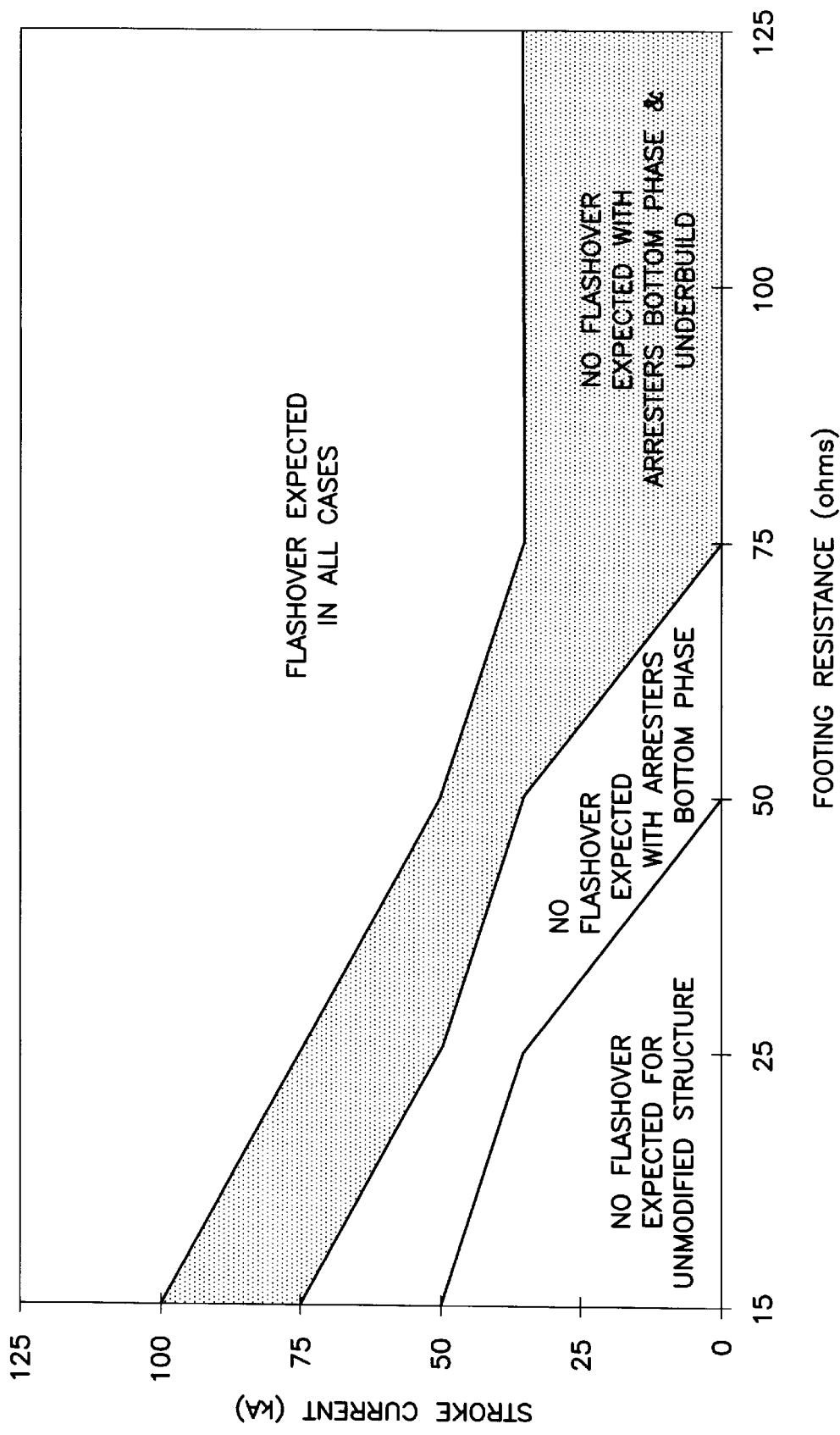
FIG. 6 is a 115 kV lightning performance design curve for a shielded single pole structure.

*based on ten year average
**based on 18 month period prior to upgrade
***based on 2.5 years since upgrade This enhanced data availability should allow much faster evaluations not only of performance changes in an asset as its condition deteriorates, but also, as in this example, to validate a performance improvement that is expected due to a modification in an asset. As shown in Table 4 above, the magnitude of the performance improvement is difficult to fully assess by measurements of total faults experienced as the only measure. FIG. 6 provides a line performance curve showing the previously described 115 kV transmission line and depicts the level of performance expected in the base condition that existed prior to the first 18 month period as the bottom curve. Further shown on this figure is the new/higher performance curve that has been realized with the addition of arresters to the bottom phases of this double circuit line. This is the first upgrade implemented. Also shown is the performance curve that was estimated by adding an additional shield wire conductor as an underbuild to this structure in combination with the arresters that have been added. These modifications have the effect of incrementally boosting the assets ability to withstand higher magnitudes of lightning activity given the difficult tower grounding conditions that exist along the asset.

Given this degree of asset performance predictability combined with experienced fault events and the lightning parameters associated with those events allows a forensic grading of performance (i.e. Location-Centered Maintenance). Once a line fault occurs, the associated lightning stroke current magnitude, polarity, time of occurrence and structure specific location can gain be used to determine if the line upgrade is performing as expected. For instance, in this example, the lightning stroke that produced the one fault since the line was upgraded had a relatively high stroke of 70 kA occurring at structure #67. Forensic analysis of this event using EMTP verified that structure #67 had a tower footing resistance of 32 ohms and based upon the arrester mitigation applied in FIG. 6 should have had a critical current threshold of 46 kA. In this case since the lightning challenge was 70 kA, this lightning stroke current magnitude exceeded the intended design threshold or critical current of the arrester mitigation as projected in FIG. 4. If the stroke current had been below the 46 kA threshold, a new performance deterioration would have been observed (a failure grade in performance assessment based on the previously known condition of that structure) and a need to investigate the likely cause of this performance decline would be conducted. However, in this case the structure was subjected to a 70 kA stroke and would receive a passing grade of performance even though a fault occurred. The performance was acceptable or passing because the lightning stroke current magnitude exceeded the design critical current threshold in this particular case. Further, from the analysis of lightning stroke current magnitudes experienced over the last two years near the asset, the probability of a 70 kA magnitude lightning stroke current is only 6.75%.

In providing further illustration to the transmission system simulation module implemented by using the Electromagnetic Transients Program EMTP, a model consisting of an untransposed nodal representation of the transmission line combined with the structures surge impedance (determined as described in the IEEE Transactions on Power Apparatus and Systems Vol. Pas-104, No. 10 October 1985) and a DC footing resistance which may be either a field measured value or other appropriate value (the simulations conducted on the 230 kV H-Frame consisted of actual measured values and a range of values between 25 ohms and 900 ohms).

Figure 7:
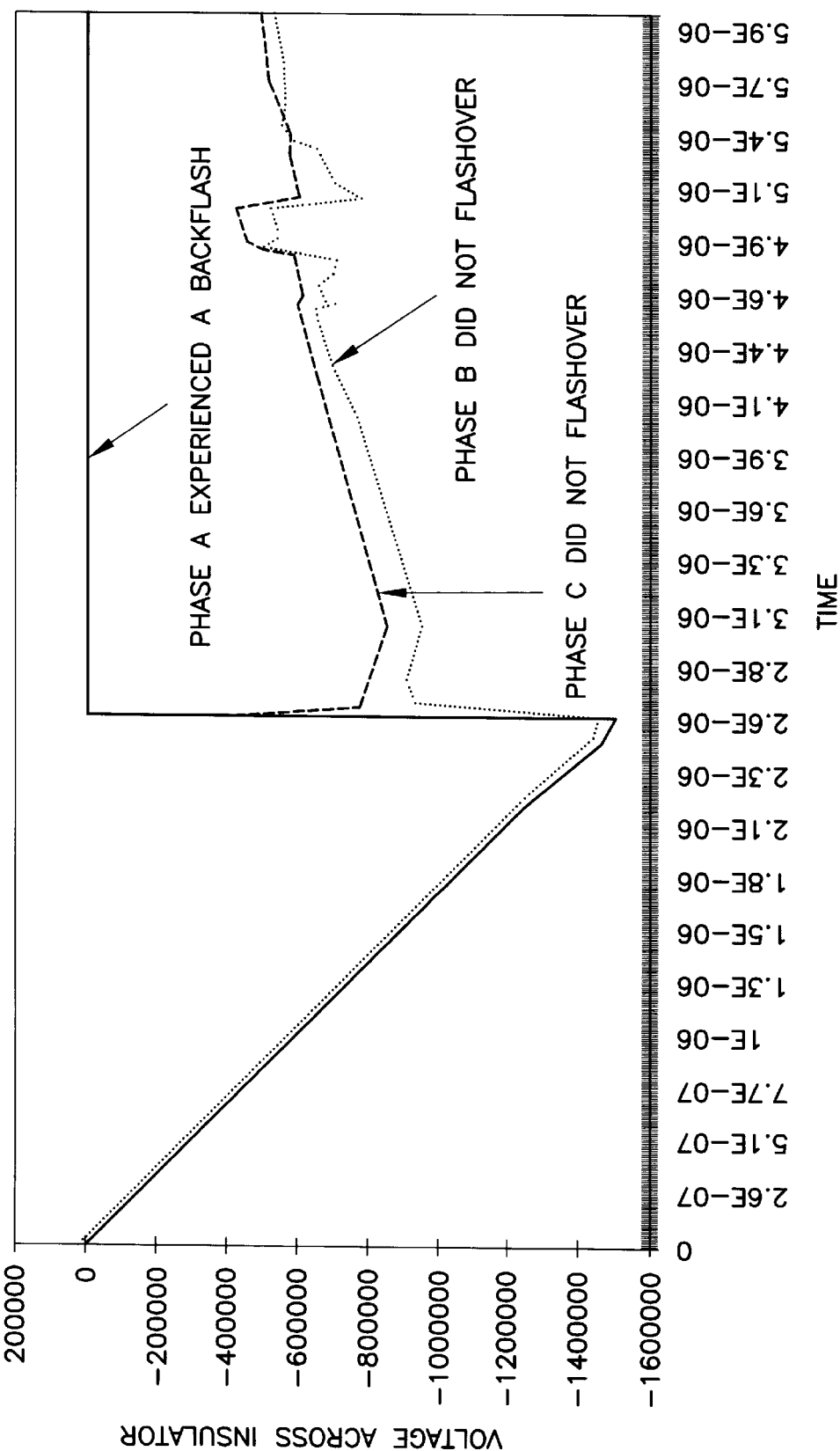
FIG. 7 is a 17 kA simulated lightning stroke to a 230 kV H-Frame shield wire at a structure with 450 Ohm footing resistance.

In order to determine the proper critical flashover potential (CFO) to model, an analysis of the various flashover paths must be conducted to determine the one with the lowest CFO. Depending on the structure design, the lowest flashover path may be through the insulator, the insulator plus any secondary insulation provided by a structure member such as the crossarm, or across the air gap between the conductor and the structure or structure ground. The CFO for the insulators can be obtained from the manufacturers data sheets the CFO provided by structures materials such as wood, or fiberglass and that provided by an air-gap may be estimated from charts and tables in the Transmission and Distribution Reference Book. FIG. 7 shows the wood pole 230 kV H-Frame structure used on the 230 kV line evaluated in this paper. The flashover path with the lowest CFO was determined to be through the porcelain insulator and then down the crossarm to the ground wire which runs down the wood support pole. The CFO for this combination of porcelain and wood insulation was estimated at 1,500 kV.

The lightning stroke was simulated using an Impulse Wave shape consisting of a ramp function with a linear rise to a maximum current amplitude and linear current decay. The front time used was 3 microseconds and the tail time was modeled as 50 microseconds. The maximum amplitude of this impulse was increased until the simulation indicated that a backflash occurred.

FIG. 7 shows plots of the voltage between the conductor and the structure ground for all three phases during a simulated 17 kA lightning stroke to the shield wire at its point of attachment to a 230 kV H-frame tower with a footing resistance of 450 ohms. The voltage buildup on all three phases is nearly symmetrical, until voltage between phase A and the tower exceeds the CFO point of 1,500 kV and backflahses. Once a phase flashovers, charge is drained off and as a result of this the rate of charge buildup on the phases which have not yet flashed is reduced. This can be seen in the FIG. 7 by the decrease in voltage potential on phase B and C which occurs immediately after phase A flashsover. However, even though the rate of charge buildup is reduced once a phase flashes over, if the stroke current amplitude is high enough, this may not be sufficient to eliminate continued charge buildup on the other phases and their eventual flashover.

Figure 8:
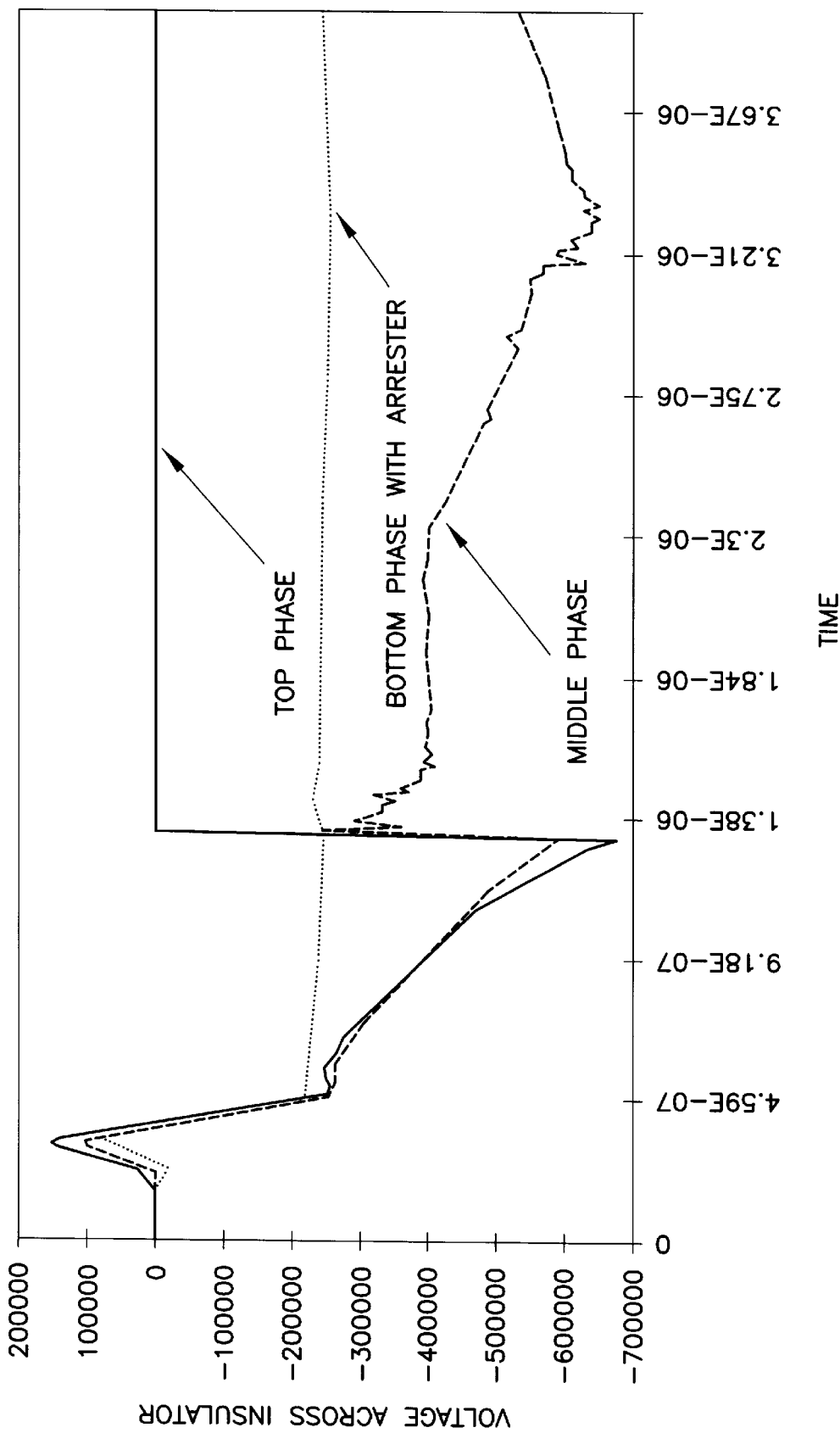
FIG. 8 is a 70 kA lightning stroke simulation to a single pole 115 kV line on shield wire near the structure resulting in disturbance.

The single steel pole 115 kV structure and line was modeled in generally the same manner as the 230 kV wood H-Frame line, shown in FIG. 8. However, due to the different voltage class and structure material and geometry, the CFO of this line was estimated to be 670 kV. The lightning stroke simulated consisted of a 70 kA stroke which modeled an actual stroke located by the NLDN near structure 67. FIG. 8 shows the plots of the voltage across the phase insulator during the simulation. The lower phase was protected with a 90 kV MCOV Arrester which conducted and clamped the voltage at approximately −210 kV. The voltage on the top and middle phases continued to rise until the top phase reached the insulators impulse flashover potential of 670 kV and backflashed. As with the 230 kV simulation, this resulted in a reduction of the potential across the middle phase which did not backflash. This simulation not only indicated that the lightning protection system was not capable of withstanding a stroke of this magnitude, but it also indicated that the top conductor would backflash for a stroke of this magnitude, which agreed with the data from the microprocessor relay present on this line.

It is to be understood that even though numerous characteristics and advantages of various embodiments of the present invention have been set forth in the foregoing description, together with details of the steps comprising location centered methodology and the function of various embodiments of the invention, this disclosure is illustrative only, and changes may be made in detail, especially in matters of structure and arrangement of steps within the principles of the present invention to the full extent indicated by the broad general meaning of the terms in which the appended claims are expressed. Further, it is intended that it will be appreciated by those skilled in the art that the teachings of the present invention can be applied to other simulation modules, like EMTP, without departing from the scope and spirit of the present invention.

What is claimed:

1. A method of servicing lightning induced disturbances occurring on a selected segment of the impacted electric power transmission system wherein said servicing includes the following steps:

provinding a simulated transmission system for the selected segment of the electric power transmission system, wherein said simulated transmission system includes transmission system data;

collecting discrete lightning event data for a geographic locale of the selected segment of the impacted electric power transmission system;

collecting discrete disturbance data for a lightning induced disturbance on the selected segment of the impacted electric power transmission system;

simulating engagement of the lightning event causing the disturbance with the selected segment of the impacted electric power transmission system;

comparing lightning event engagement simulation readings to transmission system data; and if the lightning event engagement simulation readings are greater than transmission system critical levels, no repairs on the selected segment of the impacted electric power transmission system are performed;

if the lightning event engagement simulation readings are less than transmission system critical levels, repairs on the selected segment of the impacted electric power transmission system are performed.

2. The method of claim 1 wherein the transmission system data of the transmission system includes data representing every transmission system asset for the selected segment of the impacted electric power transmission system and data representing transmission line function in accordance with the respective line performance characteristics.

* * * * *